(12) United States Patent
Chen et al.

(10) Patent No.: US 6,893,742 B2
(45) Date of Patent: May 17, 2005

(54) COPPER FOIL WITH LOW PROFILE BOND ENHANCEMENT

(75) Inventors: Szuchain F. Chen, Orange, CT (US); William L. Brenneman, Cheshire, CT (US); Andrew Vacco, Wallingford, CT (US); Nina Yukov, Orange, CT (US)

(73) Assignee: Olin Corporation, Waterbury, CT (US)

( * ) Notice: Subject to any disclaimer, the term of this patent is extended or adjusted under 35 U.S.C. 154(b) by 0 days.

(21) Appl. No.: 09/948,166

(22) Filed: Sep. 6, 2001

(65) Prior Publication Data

US 2002/0192486 A1 Dec. 19, 2002

Related U.S. Application Data

(63) Continuation-in-part of application No. 09/784,547, filed on Feb. 15, 2001, now Pat. No. 6,569,543.

(51) Int. Cl.⁷ .......................... B32B 15/00; B32B 15/04; B32B 15/20

(52) U.S. Cl. ....................... 428/675; 428/626; 428/607; 428/612; 428/674; 428/336

(58) Field of Search ................................. 428/626, 607, 428/612, 675, 687, 935, 609, 652, 621, 632, 639, 674, 680, 686, 332, 334, 335, 336, 420, 220; 205/104, 111, 170, 171, 182, 295

(56) References Cited

U.S. PATENT DOCUMENTS

| 454,381 | A | | 6/1891 | Reinfeld ...................... 205/76 |
|---|---|---|---|---|
| 3,998,601 | A | | 12/1976 | Yates et al. .................... 29/195 |
| 4,088,544 | A | | 5/1978 | Hutkin ......................... 204/12 |
| 4,169,018 | A | * | 9/1979 | Berdan et al. ................. 204/33 |
| 4,357,395 | A | * | 11/1982 | Lifshin et al. .............. 428/607 |
| 4,503,112 | A | | 3/1985 | Konicek ..................... 428/216 |
| 4,515,671 | A | | 5/1985 | Polan et al. ................ 204/228 |
| 4,568,413 | A | * | 2/1986 | Toth et al. ................... 156/151 |
| 5,049,221 | A | * | 9/1991 | Wada et al. ................. 156/151 |
| 5,066,366 | A | | 11/1991 | Lin ............................. 204/12 |
| 5,071,520 | A | | 12/1991 | Lin et al. ..................... 205/155 |
| 5,096,522 | A | * | 3/1992 | Kawachi et al. ............ 156/151 |
| 5,114,543 | A | | 5/1992 | Kajiwara et al. ........... 428/607 |
| 5,230,932 | A | | 7/1993 | Chen et al. ................. 205/152 |
| 5,322,975 | A | * | 6/1994 | Nagy et al. ................. 174/257 |
| 5,447,619 | A | | 9/1995 | Wolski et al. ................ 205/50 |
| 5,617,629 | A | * | 4/1997 | Ekstrom ...................... 29/846 |
| 5,779,870 | A | | 7/1998 | Seip ........................... 205/77 |
| 5,800,930 | A | | 9/1998 | Chen et al. ................. 428/607 |
| 6,183,880 | B1 | * | 2/2001 | Yoshioka et al. ........... 428/607 |
| 6,235,404 | B1 | * | 5/2001 | Frater ......................... 428/607 |
| 6,238,778 | B1 | * | 5/2001 | Schneider ................... 428/209 |
| 6,270,889 | B1 | * | 8/2001 | Kataoka et al. ............. 428/352 |

(Continued)

FOREIGN PATENT DOCUMENTS

EP        208 177        10/1987    ............ C25D/1/04

OTHER PUBLICATIONS

IPC, "Metal Foil for Printed Wiring Applications," Metallic Foils Task Group Standard IPC–4562, 2/00, p.p.1–20. (Feb. 2000).*

Primary Examiner—Michael LaVilla
(74) Attorney, Agent, or Firm—Todd E. Garabedian; Wiggin and Dana LLP

(57) ABSTRACT

A composite material, comprising a carrier strip the carrier strip comprising a first side the first side comprising a substantially uniform roughness, an electrolytically deposited copper foil layer having opposing first and second sides and a thickness of from 0.1 micron to 15 microns and the entire metal foil layer thickness having been deposited from a copper containing alkaline electrolyte, and a release layer effective to facilitate separation of the metal foil layer from the carrier strip disposed between and contacting both the first side of the carrier strip and the second side of the metal foil layer.

1 Claim, 9 Drawing Sheets

U.S. PATENT DOCUMENTS

| | | | |
|---|---|---|---|
| 6,319,620 B1 * | 11/2001 | Kataoka et al. | 428/626 |
| 6,346,335 B1 * | 2/2002 | Chen et al. | 428/629 |
| 6,379,487 B1 * | 4/2002 | Schneider et al. | 156/230 |
| 6,447,929 B1 * | 9/2002 | Wang et al. | 428/604 |
| 6,500,566 B1 * | 12/2002 | Smith | 428/626 |
| 6,537,675 B1 * | 3/2003 | Clouser et al. | 428/450 |
| 6,551,433 B2 * | 4/2003 | Kuwako et al. | 156/230 |
| 6,638,642 B2 * | 10/2003 | Kitano et al. | 428/607 |
| 6,649,274 B1 * | 11/2003 | Taenaka et al. | 428/457 |
| 2003/0148136 A1 | 8/2003 | Yamamoto et al. | |

* cited by examiner

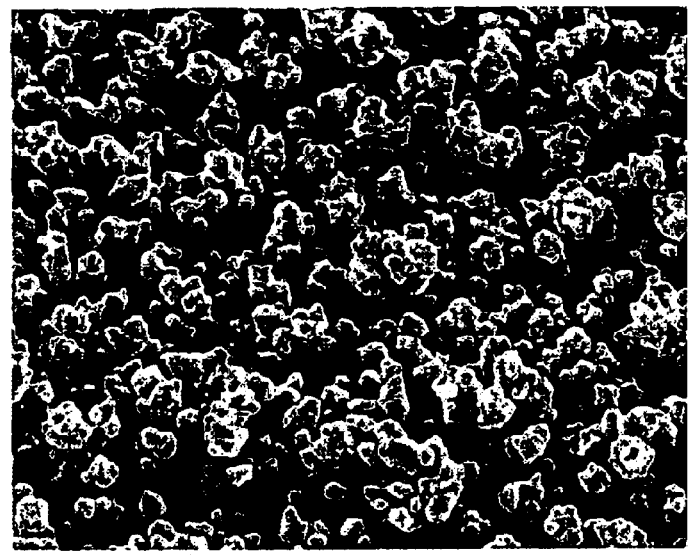
FIG. 7   5000 X
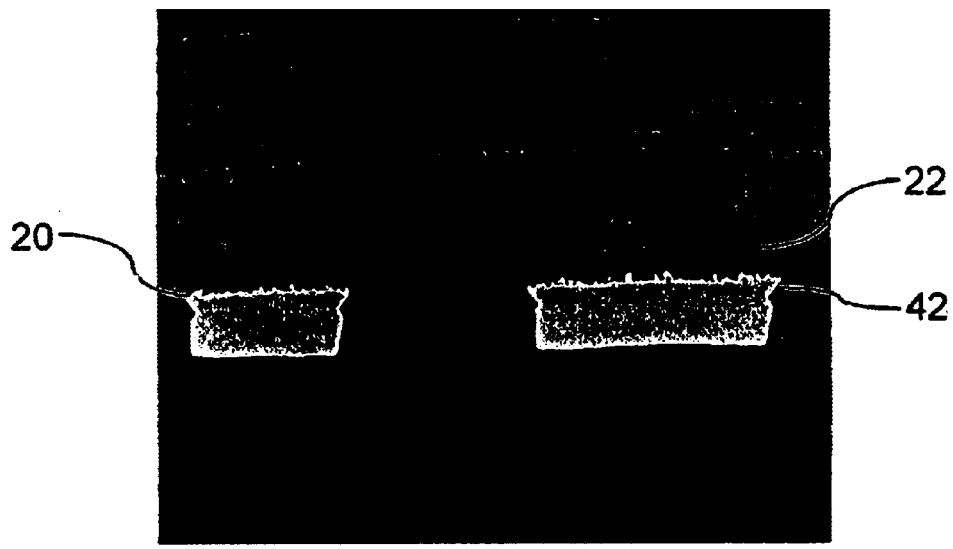
FIG. 8   450 X

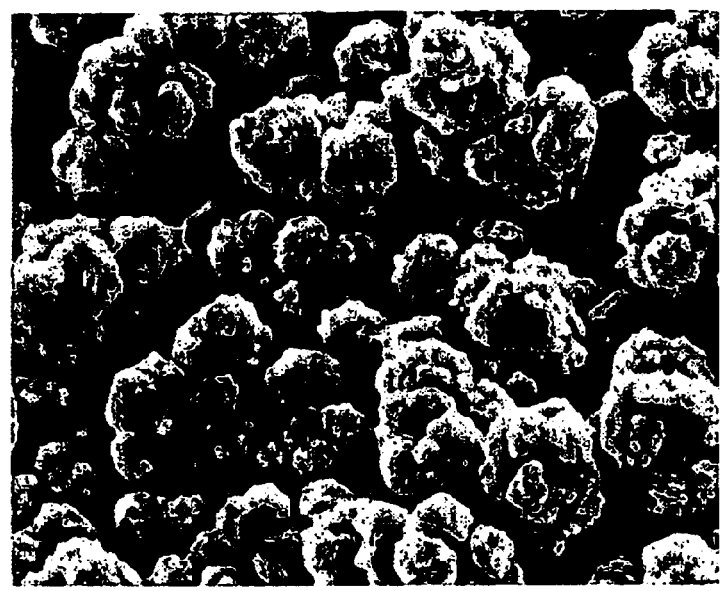
FIG.9  5000 X
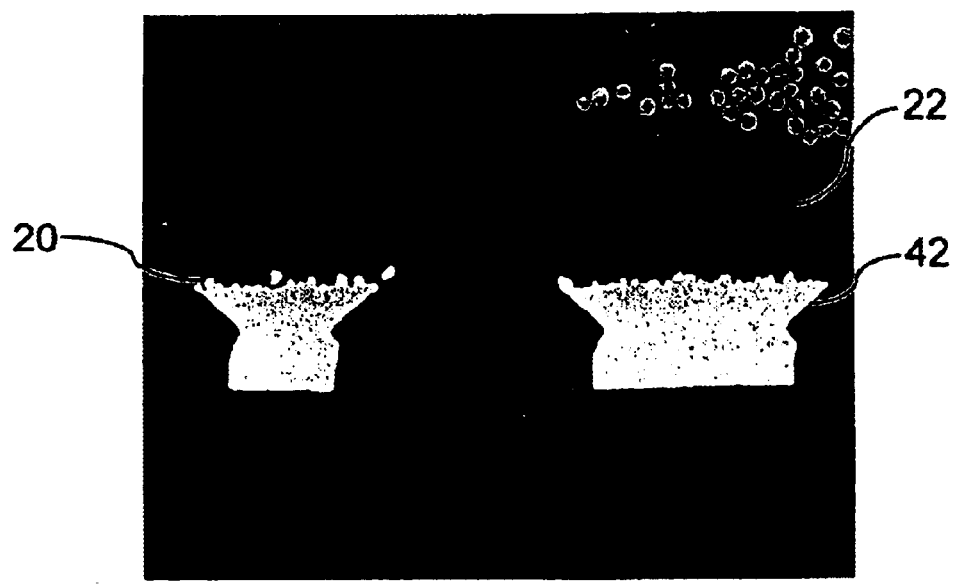
FIG.10  450 X

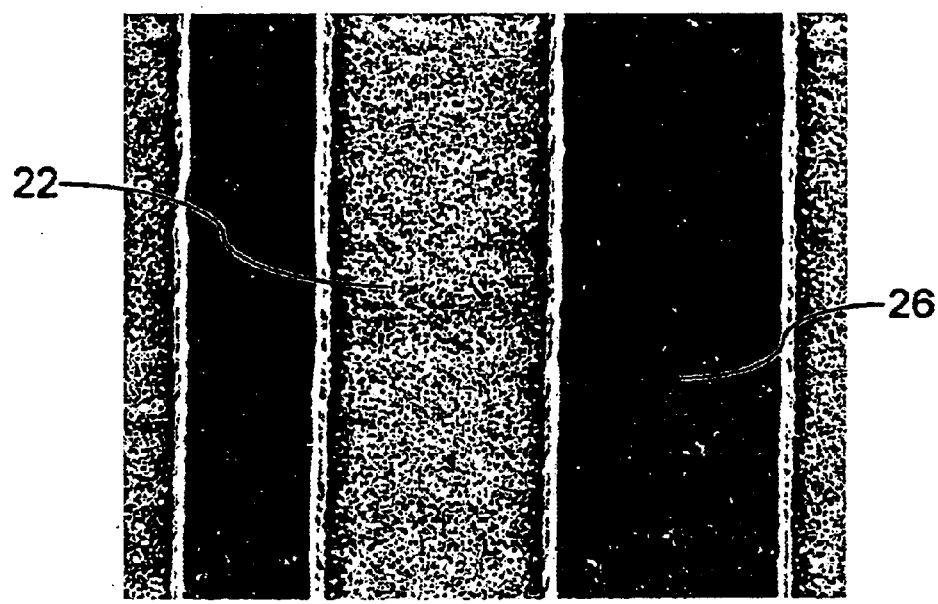
FIG.11  450 X
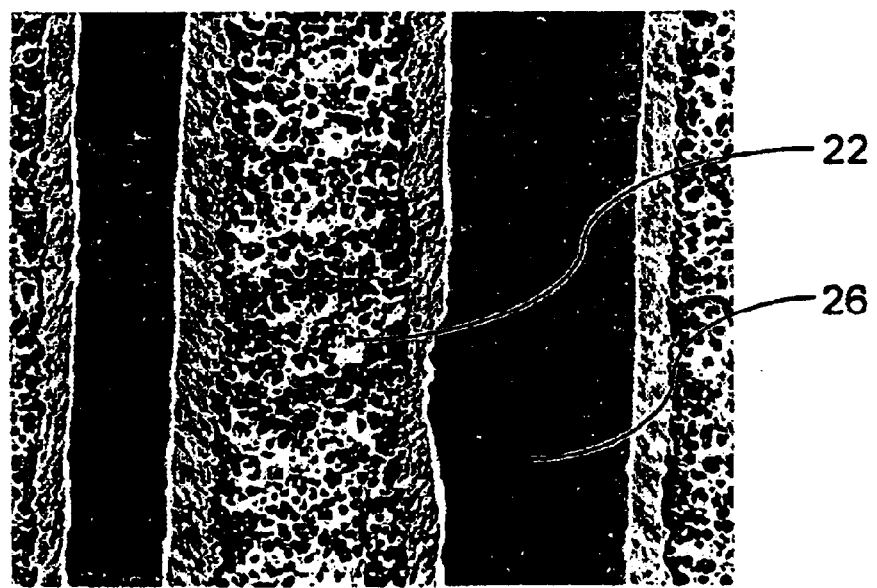
FIG.12  450 X

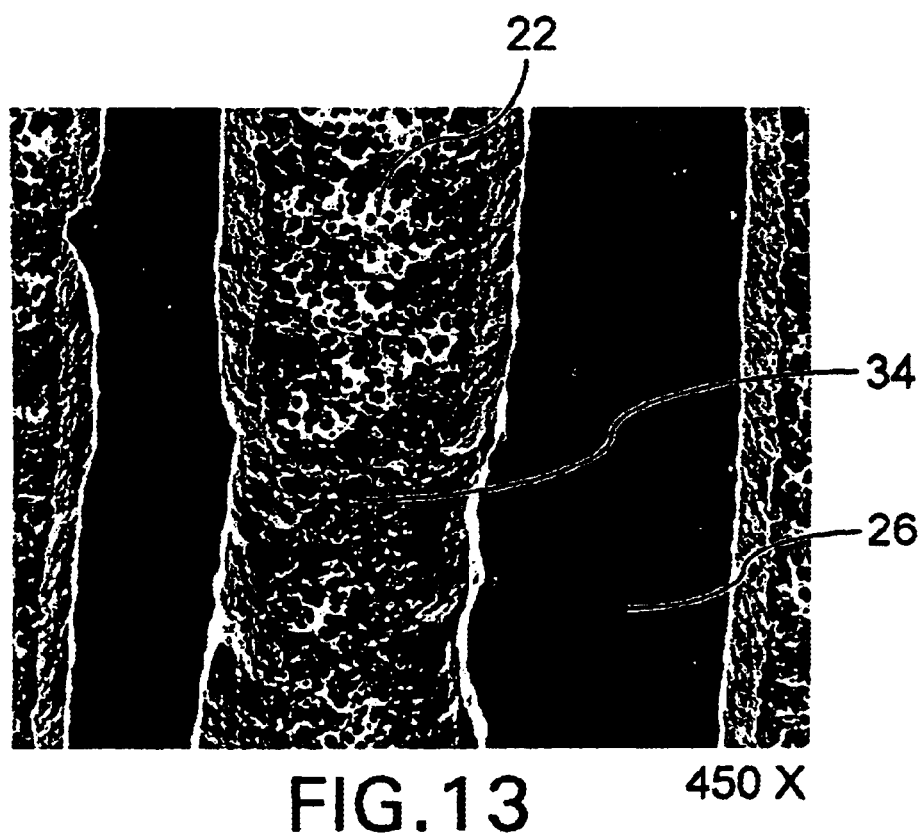
FIG. 13    450 X

COPPER FOIL WITH LOW PROFILE BOND ENHANCEMENT

CROSS REFERENCE TO RELATED APPLICATIONS

This Application is a Continuation-in-part application of U.S. Ser. No. 09/784,547 filed Feb. 15, 2001, now U.S. Pat. No. 6,569,543.

This patent application relates to U.S. Ser. No. 09/522,544 filed Mar. 10, 2000, now U.S. Pat. No. 6,346,335. The disclosures of U.S. Ser. No. 09/784,547 and U.S. Ser. No. 09/522,544 are incorporated herein by reference in their entireties.

BACKGROUND OF THE INVENTION

1. Field of the Invention

This invention relates to a composite material having an intervening release layer. More particularly, a copper foil layer is releasably bonded to a carrier layer for transport and assembly. The release layer disposed between the carrier layer and the copper foil layer facilitates separation. The copper foil layer may be laminated to a dielectric substrate in the manufacture of printed circuit boards. A low height profile bond enhancing layer is formed on a surface of the copper foil layer opposite the release layer.

2. Description of Related Art

As electronic devices evolve, there is a need for thinner and smaller printed circuits. This decrease in size leads to a requirement for finer line spacing to increase circuit trace density.

Most printed circuit boards have a dielectric substrate, such as an epoxy or polyimide, laminated to a layer of copper foil. The copper foil is etched into a desired circuit pattern. As the need for finer line resolution increases, thinner copper foil is required. This is because when copper foil is etched, etching occurs in both a vertical direction and in a horizontal direction at about the same rate. While the vertical etching is required to create spaces between adjacent circuit traces for electrical isolation, horizontal etching at the sides of a trace damages the integrity of the circuit traces. Horizontal etching limits the minimum line-to-line spacing to approximately twice the thickness of the copper foil. Another problem with thicker copper foil is that a longer time is required to etch the foil increasing the manufacturing cost and increasing the environmental concern due to the disposal or reclamation of dissolved copper. Yet another problem arises from the presence of Ni/Au overhang. Ni/Au overhang occurs when a Ni/Au coating is applied as an etch resist and remains on the finished product to preserve solderability. When a thick copper foil coated with with Ni/Au is etched, the etch undercut can be severe resulting in breakage of the Ni/Au overhang and possibly causing a short circuit in the finished product.

One copper foil presently utilized in the manufacture of printed circuit boards is referred to as one-half ounce foil. One square foot of this foil weighs approximately 0.5 ounce and has a nominal thickness of about 18 microns. Thinner copper foil, such as 9 micron thick foil, is available in the marketplace, however special care is required in handling 9 micron foil to prevent wrinkling and damage.

Facilitating the handling of 9 micron, and thinner, foils is the use of a carrier strip. The carrier strip is releasably bonded to the foil for manufacturing and lamination. Once the foil is laminated and supported by a dielectric, the carrier strip is removed. One common carrier strip is aluminum that may be removed by chemical etching, such as by immersion in sodium hydroxide, without damage to the copper foil. Etching is time-consuming and disposal may create environmental problems.

Alternatively, a carrier layer, typically formed from copper, is coated with a release layer. The copper foil layer is formed on the release layer, typically by electrolytic deposition. Adhesion between the release layer and the copper foil layer is high enough so that the copper foil layer does not separate from the carrier layer prematurely, but is also sufficiently low that separation of the carrier layer following lamination does not tear or otherwise damage the copper foil layer.

U.S. Pat. No. 3,998,601 to Yates et al. discloses a release layer formed from sulphides, chromates and oxides. An alternative release layer is disclosed to be chromium metal. U.S. Pat. No. 4,503,112 to Konicek discloses that chromium metal release layers have unpredictable adhesion and that preferred release layers include nickel, nickel/tin alloys, nickel/iron alloys, lead and tin/lead alloys. U.S. Pat. No. 5,114,543 to Kajiwara et al. discloses a composite release layer having an immersion deposited chromate layer that is coated with an electrolytically deposited copper/nickel alloy. The U.S. Pat. Nos. 3,998,601; 4,503,112 and 5,114,543 patents are incorporated by reference herein in their entireties.

U.S. Pat. No. 5,066,366 to Lin discloses forming a release layer on a copper alloy foil carrier by treating the carrier with an aqueous solution containing chromic acid and phosphoric acid. While a generally acceptable process, areas of unacceptable high adhesion may occur when a chrome phosphate release layer is formed directly on a copper alloy carrier. U.S. Pat. No. 5,066,366 is incorporated by reference in its entirety herein.

There remains a need for an improved release layer that consistently provides adequate adhesion between a carrier layer and a copper foil layer to insure that the copper foil layer remains attached to the carrier layer during transport and processing, such as lamination to a dielectric substrate. However, the adhesion to the release layer is sufficiently low that the carrier layer may be removed following lamination without damaging the copper foil layer.

SUMMARY OF THE INVENTION

Accordingly, it is an object of the invention to provide a thin metallic foil that is releasably attached to a carrier layer. A second object of the invention is to provide a method for the manufacture of the metallic foil/carrier layer composite. A further object of the invention is to provide a thin copper foil useful for lamination to a dielectric substrate for the manufacture of printed circuit boards and flexible circuits.

It is a feature of the invention that the metal foil is releasably attached to a carrier layer and a force of at least 0.02 pound per inch is required to separate the layers thereby insuring that the metal foil layer is not prematurely released. It is a further feature of the invention that a maximum force of 2 pounds per inch, and typically less than 1 pound per inch, is required to separate the metal foil layer from the carrier layer thereby facilitating removal of the carrier layer without damage to the copper foil layer.

A further feature of the invention is that the chemical solutions utilized for deposition of the release layer are dilute aqueous solutions that are believed to present less of an environmental hazard than more concentrated electrolytes previously utilized to deposit release layers such as metallic chromium.

Among the advantages of the invention are that the metal layer may be a thin copper foil with a thickness of 15 microns or less. Such a thin foil facilitates the manufacture of printed circuit boards and flexible circuits with fine features. A further advantage is that the carrier layer is mechanically separable from the metal foil layer and does not require etching for removal.

A further advantage is that the foils of the invention have less surface roughness than conventionally formed foils. As a result, undercutting during etching is reduced. Furthermore, the low-profile treated surface is more suitable for high impedance/high frequency applications. The smoothness of the surface of the copper foil opposite the release layer allows for improved imaging and fine line capability in the manufacturing of circuits.

In accordance with the invention, there is provided a composite material. The composite material has a support layer and a metal foil layer. A release layer is disposed between and contacts both the support layer and the metal foil layer. This release layer consists essentially of an admixture of a metal and a non-metal.

In one embodiment of the invention, the composite material is then laminated directly to a dielectric substrate.

There is further provided a method for the manufacture of a composite material that includes the steps of (1) providing an electrically conductive support layer; (2) anodically treating the electrically conductive support layer in a first aqueous electrolyte that contains first metal ions and hydroxide ions; (3) subsequently cathodically depositing a release layer onto the electrically conductive support layer in a second aqueous electrolyte that contains second metal ions and hydroxide ions; and (4) electrolytically depositing a metal foil on the release layer.

One embodiment of this method of manufacture includes the additional steps of laminating the metal foil layer to a dielectric substrate and then separating the electrically conductive support layer from the laminate at the release layer. The metal foil layer, now bonded to the dielectric layer, may then be formed into a plurality of electrically isolated circuit traces.

The above stated objects, features and advantages will become more apparent from the specification and drawings that follow.

IN THE DRAWINGS

FIG. 7 is a photomicrograph at a magnification of 5,000× illustrating a very low surface profile bond strength enhancement in accordance with the invention.

FIG. 8 is a cross-sectional view of the very low surface profile bond strength enhancement of FIG. 7 embedded in a dielectric substrate.

FIG. 9 is a photomicrograph at a magnification of 5,000× illustrating a typical low surface profile bond strength enhancement as known from the prior art.

FIG. 10 is a cross-sectional view of the low surface profile bond strength enhancement of FIG. 9 embedded in a dielectric substrate.

FIG. 11 is a photomicrograph at 450× illustrating the surface topography of a dielectric layer upon removal of a very low surface profile bond strength enhancement in accordance with the invention.

FIG. 12 is a photomicrograph at 450× illustrating the surface topography of a dielectric layer upon removal of a low surface profile bond strength enhancement as known from the prior art.

FIG. 13 is a photomicrograph at 450× of the surface topography of a dielectric layer following removal of a low surface profile bond strength enhancement illustrating incomplete copper removal.

Figure 14:
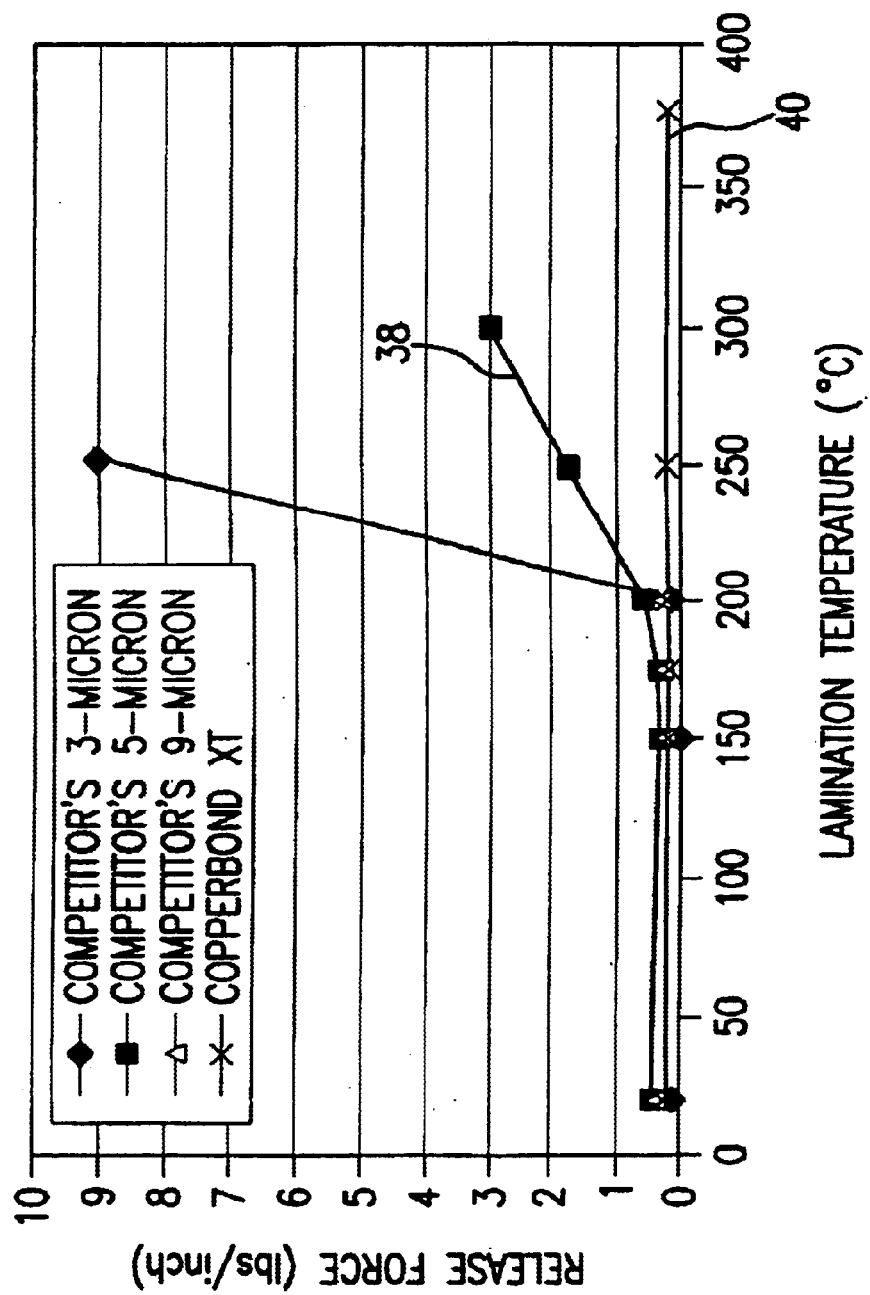

FIG. 14 graphically illustrates release layer separation force as a function of lamination temperature.

Figure 15:
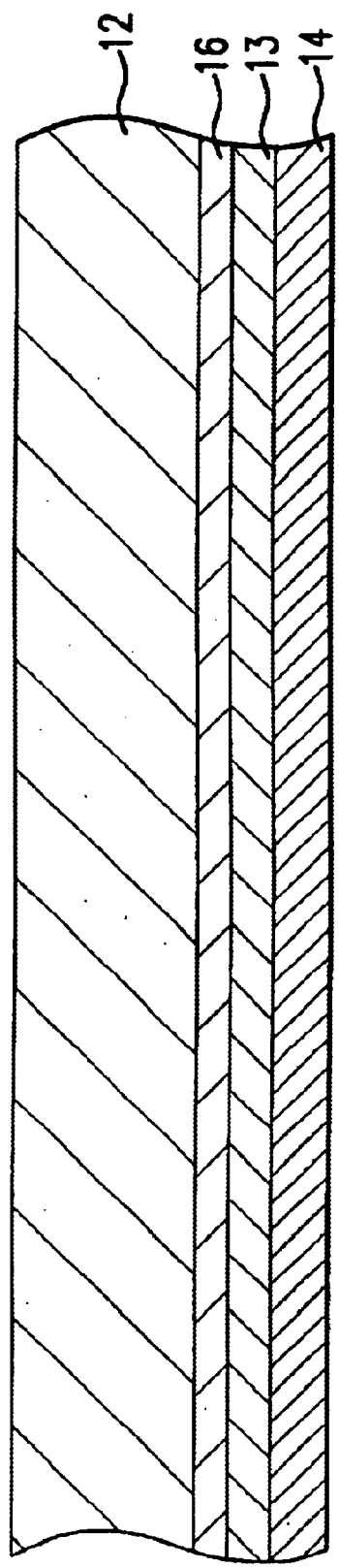

FIG. 15 illustrates in cross-sectional representation the composite material of the present invention with an interposed dark layer.

DETAILED DESCRIPTION

Figure 1:
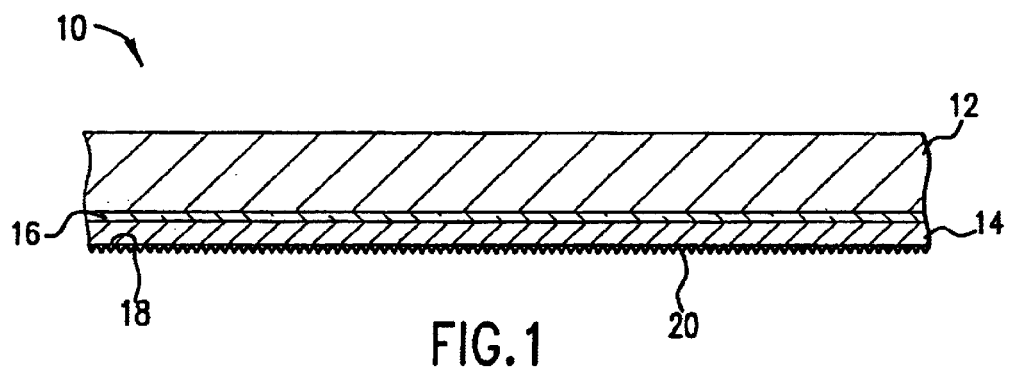
FIG. 1 illustrates in cross-sectional representation a composite material in accordance with the invention.

FIG. 1 illustrates in cross sectional representation a composite material 10 in accordance with the invention. The composite material 10 includes a support layer 12 and a metal foil layer 14. The support layer 12 may be formed from any material capable of supporting the metal layer 14. Preferably, the support layer 12 is formed from an electrically conductive metal and has a thickness of at least 18 microns (1 micron=$1\times10^{-6}$ meter). Suitable materials for the support layer include stainless steel, aluminum, aluminum alloys, nickel, copper and copper alloys.

When the support layer is stainless steel, a release layer, as described below, may be optional.

Preferred for the support layer are copper alloys such as those alloys designated by the CDA (Copper Development Association, New York, N.Y.) as copper alloy C110 (nominal composition by weight 99.95% copper (minimum) and 0.04% oxygen), copper alloy C715 (nominal composition by weight of 30% nickel and 70% copper), copper alloy C510 (nominal composition by weight of 94.5% copper, 5% tin and 0.2% phosphorous) and copper alloy C102 (oxygen-free high copper having a minimum copper content of, by weight, 99.9%) as well as brasses, mixtures of copper and zinc containing up to 40%, by weight, of zinc.

Most preferably, the support layer 12 is a wrought material as opposed to electrolytically formed. The wrought materials tend to have a higher strength and a higher stiffness facilitating handling of the materials and enhancing peelability of a deposited foil. The support layer may be coated with a copper or nickel flash to cover up defects, such as incurred during rolling, that may interfere with the deposition or removal of the foil layer.

The support layer 12 may be a single material or composite material with the second layer applied by any known process including rolling, plating and sputtering. Combinations of copper and nickel or copper and aluminum are believed useful as composite support layers. In one embodiment, the support layer 12 is comprised of a copper-nickel-silicon base alloy.

Preferably, the thickness of the support layer 12 is from 18 microns to 140 microns and more preferably from 35 microns to 70 microns.

The metal foil layer 14 is any electrolytically deposited metal or metal alloy and is preferably copper. The metal foil layer typically has a thickness of under 15 microns and more preferably is under 10 microns. In accordance with one aspect of the invention, most preferably, the metal foil layer is electrolytically deposited from an alkaline copper containing electrolyte followed by electrolytic deposition from an acidic copper containing electrolyte and has a thickness of from about 1 to about 6 microns and nominally about 5 microns. In accordance with another aspect of the invention, the metal foil layer is electrolytically deposited only from an alkaline copper containing electrolyte and has a thickness of from about 0.1 micron to 6 microns and nominally about 5 microns. As described below, the metal foil layer 14 may be deposited from a single electrolyte or from combinations of multiple electrolytes.

Disposed between and contacting both the support layer 12 and the metal foil layer 14 is a release layer 16. The release layer 16 consists essentially of an admixture of a metal and a non-metal, with the bulk believed to be the non-metal. It is believed that the metal component of the release layer constitutes from 5% to 40%, by atomic percent.

Suitable metals are those that are reversibly, electrochemically, oxidizable in a suitable electrolyte, as opposed to dissolving. The list of suitable metals includes nickel, chromium, titanium, copper, manganese, iron, cobalt, tungsten, molybdenum and tantalum.

Preferred metals are nickel, chromium and mixtures thereof. Preferred non-metals are oxides, hydroxides, phosphates and chromates of the metals. Preferred combinations are mixtures of chromium and chromium oxide, nickel and nickel oxide, chromium and chromium phosphate, nickel and nickel chromate, and nickel and nickel phosphate. The release layer is quite thin, on the order of 0.012 micron (120 angstroms) thick and typically from about 0.001 micron to about 0.05 micron thick.

A most preferred release layer consists essentially of chromium and at least one non-metal selected from the group consisting of oxides of chromium and hydroxides of chromium. It has been established that the force required to separate the metal foil from the carrier strip with this most preferred release layer is consistently less than 7.1 kg/m (0.4 pounds per inch) even after exposure to temperatures of up to 380° C. for one hour. Since the metal foil is typically laminated, using heat and pressure, to a dielectric substrate prior to separation from the support layer, the release force as a function of temperature is an important consideration.

Figure 6:
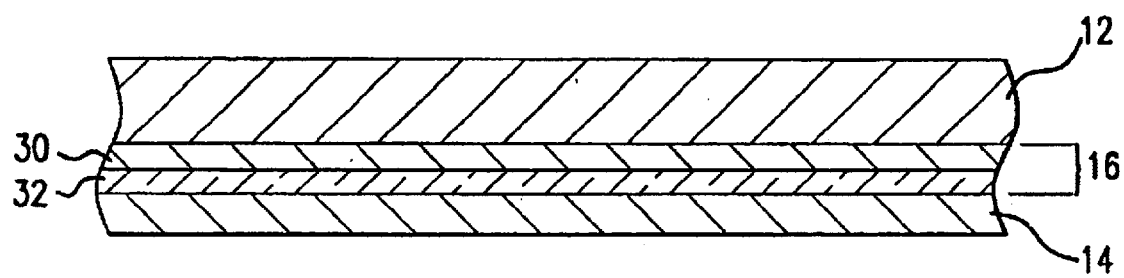
FIG. 6 illustrates an alternative release layer in cross-sectional representation.

Alternatively, the release layer 16 is a composite as illustrated in cross sectional representation in FIG. 6. A first portion 30 of the release layer 16 is a metallic layer, as described above, and is preferably selected to be nickel, chromium or a mixture thereof. This first portion 30 directly contacts the support layer 12 and is typically deposited by electroplating. Other methods of deposition such as immersion plating or vapor deposition may also be utilized.

A second portion 32 of the release layer 16 is an admixture of a metal and a non-metal as described above. The second portion 32 directly contacts the metal foil layer 14.

With reference back to FIG. 1, on a side 18 of metal foil layer 14 opposite the release layer 16, a bond strength enhancing agent 20 may be deposited. Suitable bond strength enhancing agents include electrolytically deposited copper dendrites or copper-nickel dendrites having a height of between about 0.5 and 2.7 microns and a height to diameter aspect ratio of between about 1 and 5. Such dendrites may be electrolytically deposited from an aqueous solution containing copper ions utilizing copper or lead electrodes with the composite material 10 as the cathode. Pulses of DC current are applied between the anode and the cathode as more fully described in U.S. Pat. No. 4,515,671 to Polan, et al., that is incorporated by reference in its entirety herein Other bond strength enhancing agents include an electrolytically deposited mixture of chromium and zinc as disclosed in U.S. Pat. No. 5,230,932 to Lin, et al., a silane based coating as disclosed in U.S. Pat. No. 5,071,520 to Lin, et al., copper oxides, mechanical abrasion of surfaces, alternating current etching and micro-etching.

Bond strength enhancing processes that give a very low surface profile, as achieved with the pulsed DC current of U.S. Pat. No. 4,515,671, are preferred. Preferably, the average surface roughness ($R_a$) is 0.40 micron or less. The average surface roughness is defined as the arithmetic average value of all absolute distances of the roughness profile from the center line within the measuring length. The roughness profile is determined utilizing a profilometer with a diamond stylus (contact method).

Typical low profile surface enhancements have a nodule height of greater than 3 microns and a nominal $R_a$ value in excess of 0.4 micron. The very low profile surface enhancement of the invention has surface enhancements with a nodule height of between 0.5 micron and 2.7 microns. Preferably, the maximum nodule height is between 1.8 microns and 2.5 microns. The $R_a$ value is less than 0.4 micron and preferably $R_a$ is between 0.20 and 0.35 micron.

The desirability of a lower surface profile is contrary to the typical surface profile applied to relatively thick, on the order of 12 micron, foil. Typically, higher surface profiles are utilized to maximize peel strength once the copper foil is laminated to a dielectric circuit board.

FIG. 7 is a photomicrograph at 5,000 times magnification illustrating the very low surface profile bond strength enhancement of the invention. FIG. 8 is a cross-sectional view at a magnification of 450 times that shows the bond strength enhancement 20 embedded into dielectric substrate 22.

FIG. 9 is a photomicrograph at 5,000 times magnification illustrating a low surface profile bond strength enhancing agent as known from the prior art. FIG. 10 is a cross-sectional view at a magnification of 450 times that shows the bond strength enhancing agent 20 embedded into dielectric substrate 22.

As shown in FIGS. 11 and 12, when circuit traces 26 are formed by etching the metal foil layer, the exposed surface of dielectric substrate 22 has a topography that replicates the texture of the bond surface enhancing agent. FIG. 11 is a photomicrograph of the surface texture resulting from etching a copper foil with the very low surface profile bond enhancing agent of the invention. The magnification is 450 times.

FIG. 12 is a photomicrograph at a magnification of 450 times illustrating the surface of the dielectric substrate 22 following removal by etching of a copper foil with a typical low surface profile bond enhancement agent as known from the related art. A disadvantage of the typical low surface profile bond strength enhancing agent is more apparent with reference to FIG. 13 that is also at a magnification of 450 times. FIG. 13 illustrates that with the typical low surface profile bond strength enhancing agent, metallic dendrites may be embedded deeply into the dielectric substrate 22 and etching does not effectively remove all of the copper between adjacent circuit traces 26 leading to a short circuit 34.

Further, the smoother etch-exposed dielectric surface mirroring the very low profile bond surface enhancement (FIG. 11) is much less likely to entrap contaminants and is much easier to clean as compared to the more textured etch-exposed dielectric surface mirroring the typical low profile bond surface enhancement (FIG. 12). Therefore, it should be possible to achieve a higher surface insulation resistance (SIR) capability. A high SIR is important in the design of high density interconnect circuits where the circuit traces are routed close together, for example, 25–125 micron circuit traces separated by 25–100 micron spaces.

Figure 2:
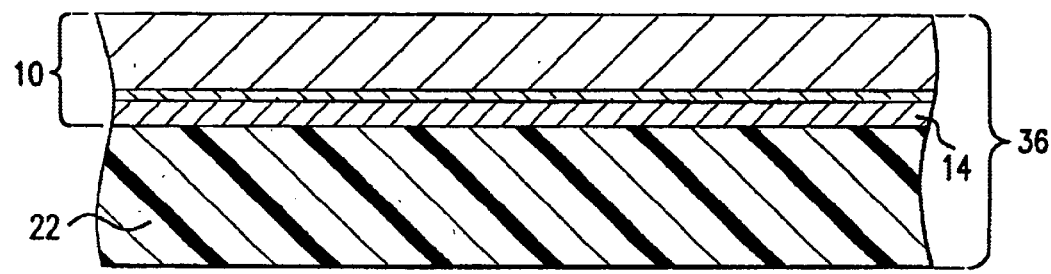
FIG. 2 illustrates in cross-sectional representation the composite material of the invention laminated to a rigid dielectric as a precursor to a printed circuit board.

For the manufacture of a printed circuit board, the composite material 10 is bonded to a dielectric substrate 22 forming circuit precursor 36 as illustrated in FIG. 2. Metal foil layer 14 may be laminated through the addition of heat and pressure to a rigid dielectric for the manufacture of a printed circuit board. Typical lamination parameters are a temperature of about 180° C. for 50 minutes. Optionally, a polymer adhesive may assist in formation of the bond. Typical rigid materials for the dielectric substrate include fiberglass reinforced epoxies, such as FR4. The dielectric substrate may also be an electrically conductive material coated with a dielectric material such as a metal cored printed circuit board substrate or anodized aluminum.

Figure 3:
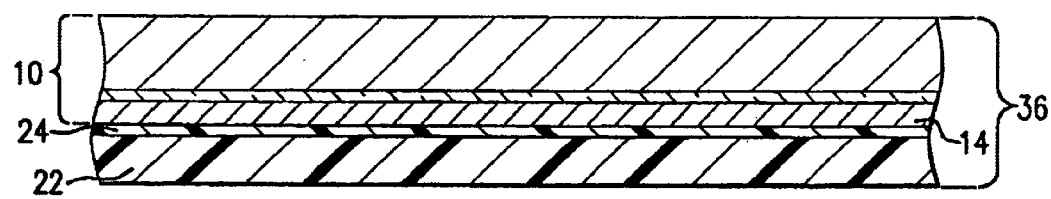
FIG. 3 illustrates in cross-sectional representation the composite material of the invention laminated to a flexible dielectric as a precursor to a flexible circuit.

Alternatively, as illustrated in FIG. 3, the dielectric substrate 22 is a flexible polymer film such as a polyimide or polyamide. In this instance, the use of a polymer bond agent 24 such as acrylic or epoxy polymer is preferred. As in the preceding embodiment, metal foil layer 14 is bonded to the dielectric substrate 22 forming circuit precursor 36. Rather than laminating the flexible polymer to the metal foil layer, the flexible polymer may be cast on to the metal foil layer as a liquid or gel and cured to a flexible film.

After the composite material 10 is bonded to the dielectric substrate 22, the carrier layer 12 and release layer 16 are removed by mechanical means. Typically, removal is by applying a force to the carrier layer/release layer in one direction and an opposing force to the dielectric substrate/metal foil layer in a 90° direction. The forces may be either manually or mechanically applied. The force required for separation, referred to as release force, is at least 0.02 pound per inch and preferably at least 0.05 pound per inch. This minimum release force is required to prevent the metal foil layer 14 from separating from the support layer 12 prematurely, such as during transport or during bonding to the dielectric substrate. The release force should also be less than 2 pounds per inch and preferably less than 1 pound per inch to ensure that during removal the metal foil layer remains adhered to the dielectric substrate 22 and does not tear or partially remain with composite material 10. Preferably, the release force is between 0.02 pound per inch and 2.0 pounds per inch and more preferably between about 0.05 pound per inch and 1.0 pound per inch.

Figure 4:
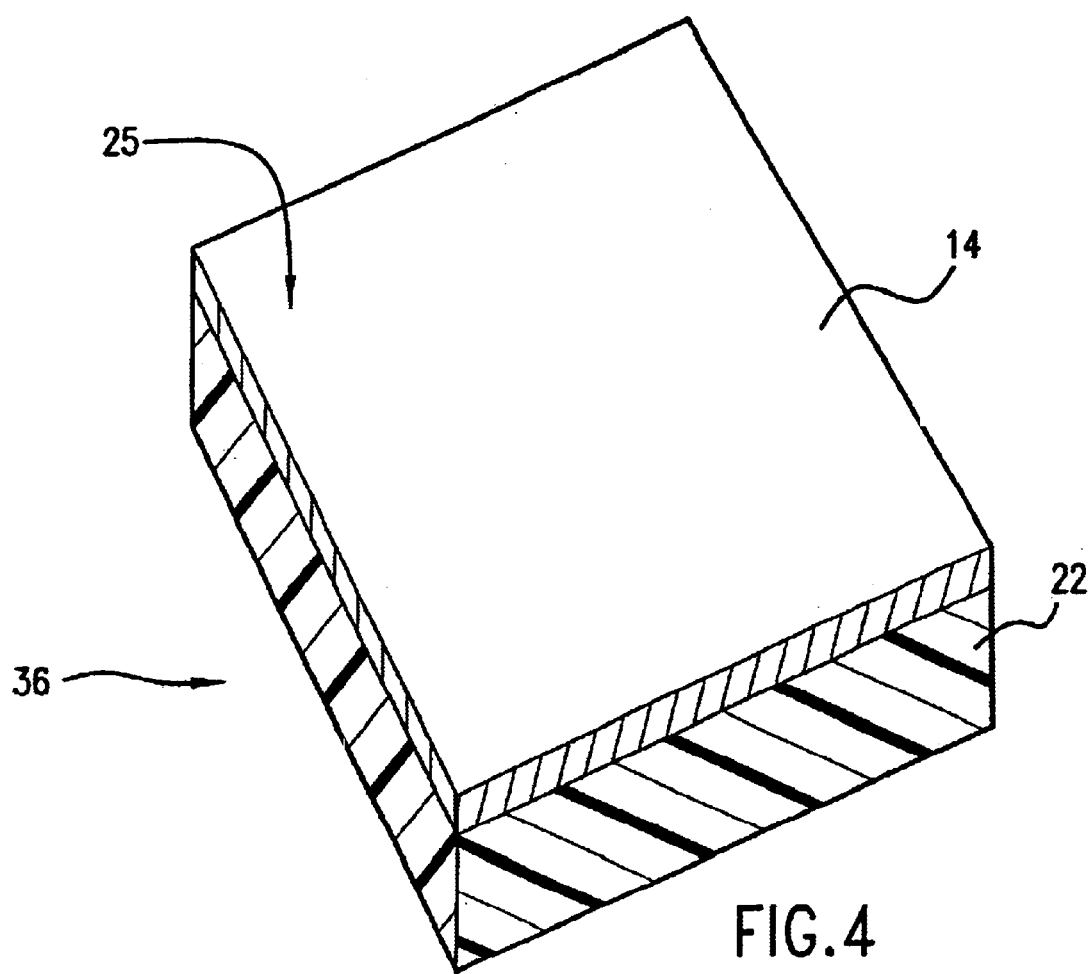
FIG. 4 is a perspective view of the printed circuit board precursor subsequent to removal of the carrier layer.

FIG. 4 is perspective view of a circuit precursor 36 with metal foil layer 14 bonded to dielectric substrate 22. While FIG. 4 shows a single metal foil layer bonded to the dielectric substrate 22, additional metal foil layers may be bonded to top surface 25 of the metal foil layer to form a multi-layer printed circuit board.

Figure 5:
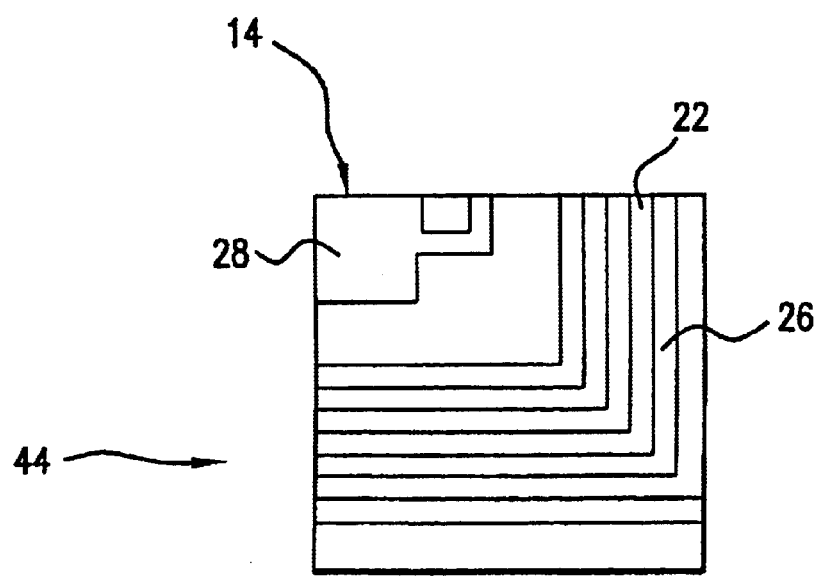
FIG. 5 illustrates in top planar view circuitry formed from the structure of FIG. 4.

With reference to FIG. 5, the metal foil layer 14 may be chemically etched to form a printed circuit panel 44 having a plurality of conductive features such as circuit traces 26 and die pads 28. Electrical isolation between conductive features is provided by dielectric substrate 22. Electrically conductive features may be formed by any process known in the art such as photolithography.

The following methods are useful for producing the composite material described above. It is recognized that variants of each method may be utilized and that different aspects of the various methods may be mixed together to produce a desired result. All methods generally require appropriate degreasing or cleaning as a first step and rinsing, such as with deionized water, between appropriate steps.

In accordance with a first embodiment, a carrier strip formed from copper or a copper alloy has a thickness effective to support a metal foil layer. An exemplary nominal thickness for the carrier strip is approximately 35–70 microns. The carrier strip is immersed in a dilute aqueous, alkaline sodium dichromate solution having the parameters specified in Table 1. All solutions disclosed herein are aqueous, unless otherwise specified. When a single value is given, that value is nominal.

TABLE 1

| | |
|---|---|
| Sodium hydroxide | 10–50 grams per liter (g/l) (broad range) |
| | 20–35 g/l (preferred range) |
| Chromium ions, such as from sodium dichromate | 0.1–10 g/l (broad range) |
| | 0.5–5 g/l (preferred range) |
| Operating Temperature | 35° C.–50° C. |
| PH | Greater than 11 |
| Counter Electrode | Stainless steel |
| Voltage | 1 volt–6 volts |
| Current Density Anodic step | 0.5–10 amps per square foot (ASF) (broad range) |
| | 1–5 ASF (preferred range) |
| Current Density Cathodic step | 0.5–40 amps per square foot (ASF) (broad range) |
| | 1–20 ASF (preferred range) |
| Time (anodic step) | 1–60 seconds (broad range) |
| | 5–20 seconds (preferred) |
| Time (cathodic step) | 1–60 seconds (broad range) |
| | 5–20 seconds (preferred) |

The carrier strip is immersed into an electrolytic cell containing the electrolyte and a voltage is impressed across the cell with the carrier strip as the anode. The anodic treatment generates a uniform microroughness on the surface of the carrier strip and induces a subsequent uniform metal foil layer copper deposit. On completion of the anodic treatment, the carrier strip is maintained in the same electrolyte and the polarity of the electrolytic cell is reversed. The carrier strip is made the cathode to deposit a thin, on the order of 10–500 angstrom, layer that is believed to be an admixture of chromium and chromium oxides on the carrier strip. This admixture forms the release layer that facilitates separation of the carrier strip subsequent to lamination or other processing.

The release layer is formed to a maximum thickness of about 500 angstroms. When the release layer thickness exceeds this maximum, the minimum release force requirements are not consistently achieved. Since the thickness of the release layer may be less than the microscopic surface roughness of the copper foil, the precursor anodic treatment is used to achieve a more uniform surface finish.

Subsequent to rinsing, a seed layer of copper with a nominal thickness of between 0.1 and 0.5 micron of copper is deposited on the release layer utilizing the parameters specified in Table 2.

TABLE 2

| | |
|---|---|
| Copper ions, such as from copper sulfate and/or copper pyrophosphate | 5–35 g/l (broad range) 15–25 g/l (preferred range) |
| Optional inclusions of leveling agents, complexing agents and surfactants | Amount as required |
| Operating Temperature | 35° C.–70° C. |
| pH | 6–10 |
| Anode Material | Stainless Steel or copper |

TABLE 2-continued

| | |
|---|---|
| Voltage | 3–7 volts |
| Current Density | 10–50 ASF |
| Time | 5–100 seconds |

The seed layer forms a nucleating agent for the subsequent high speed deposition of a copper foil layer. While the seed layer is preferably formed from copper, it may be any electrically conductive metal that can be deposited in a mildly acidic to alkaline solution and is etchable in the same chemical solutions as copper. Such other metals for the seed layer include copper alloys, tin, iron, zinc, nickel, cobalt, etc. The seed layer protects the release layer from chemical attack in an electrolyte utilized to deposit the bulk of the metal foil layer thickness. Typically, to maximize manufacturing speed, an acid copper electrolyte as specified in Table 3 is utilized.

Alternatively, immersion time in the copper containing alkaline electrolyte, such as that disclosed in Table 2, is increased to on the order of 100 seconds to 20 minutes to deposit a copper layer with a thickness of from approximately 1.0 to 15 microns. In this aspect of the invention, the subsequent step of building up the copper thickness in a copper containing acidic electrolyte is omitted.

TABLE 3

| | |
|---|---|
| Copper ions, such as from copper sulfate | 20–80 g/l (broad) 50–70 g/l (preferred) |
| Sulfuric acid | 30–200 g/l (broad) 40–100 g/l (preferred) |
| Operating Temperature | 25° C.–70° C. |
| PH | Less than 1.5 |
| Anode Material | Lead or copper |
| Voltage | 5–10 volts |
| Current Density | 30–1000 ASF (broad) 40–500 ASF (preferred) |
| Time | 0.5–8 minutes (broad) 1–5 minutes (preferred) |

To enhance adhesion, a dendritic treatment may be used to roughen the outside surface of the metal foil layer. One suitable dendritic treatment utilizes the parameters specified in Table 4. Alternatively, an anti-tarnish layer such as a mixture of chromium and zinc may be deposited to increase adhesion without increasing surface roughness.

TABLE 4

| | |
|---|---|
| Copper ions, such as from copper sulfate | 15–70 g/l (broad) 18–25 g/l (preferred) |
| Sulfuric acid | 10–200 g/l (broad) 35–100 g/l (preferred) |
| Sodium lauryl sulfate | 1–20 ppm |
| Operating Temperature | 25° C.–55° C. |
| pH | Less than 1.5 |
| Anode Material | Lead or copper |
| Voltage | 5–10 volts |
| Current Density | 50–1000 ASF (broad) 100–500 ASF (preferred) |
| Time | 4–60 seconds (broad) 4–40 seconds (preferred) |

In a second embodiment, a carrier strip as described above is immersed in the solution of Table 1 for a time of from two to sixty seconds without utilizing electric current. A nominal 5 micron copper foil layer and dendritic treatment is then applied as above.

In accordance with a third embodiment of the invention, a copper carrier strip, as described above, is electrolytically coated with a thin, on the order of between 0.05 micron and 2 microns, layer of nickel utilizing the parameters described in Table 5.

TABLE 5

| | |
|---|---|
| Nickel sulfamate | 150–600 g/l (broad) 400–500 g/l (preferred) |
| Nickel chloride | 0–15 g/l (broad) 0–7 g/l (preferred) |
| Boric acid | 25–50 g/l (broad) 35–45 g/l (preferred) |
| Operating Temperature | 45° C.–60° C. |
| pH | 2–5 |
| Anode Material | Nickel or Stainless Steel |
| Voltage | 0.5–5 volts |
| Current Density | 20–60 ASF |
| Time | 20–60 seconds |

A chromium phosphate release layer is then applied over the thin layer of nickel by immersion in a dilute chromic acid/phosphoric acid solution having the parameters disclosed in Table 6.

TABLE 6

| | |
|---|---|
| Chromic acid | 0.1–20 g/l (broad) 0.2–10 g/l (preferred) |
| Phosphoric acid | 0.1–80 g/l (broad) 0.5–40 g/l (preferred) |
| Operating Temperature | 20° C.–60° C. |
| pH | 0.1–3 |
| Time | 5–120 seconds (broad) 10–40 seconds (preferred) |

A nominal 5 micron copper foil metal layer is then deposited as above followed by a dendritic treatment as above.

In accordance with a fourth embodiment of the invention, a thin, on the order of between 0.05 micron and 2 microns, layer of nickel is deposited on a copper alloy carrier strip as above. A release layer is deposited from an aqueous solution containing sodium hydroxide as disclosed in Table 7.

TABLE 7

| | |
|---|---|
| Sodium hydroxide | 10–80 g/l (broad) 20–50 g/l (preferred) |
| Operating Temperature | 35° C.–60° C. |
| pH | Greater than 11 |
| Counter Electrode | Stainless steel |
| Voltage | 0.5–5 volts |
| Current Density (anodic step) | 1.0–50 ASF (broad) 2.5–35 ASF (preferred) |
| Current Density (cathodic step) | 0.5–40 ASF (broad) 1.0–25 ASF (preferred) |
| Time (anodic step) | 2–60 seconds 5–30 seconds |
| Time (cathodic step) | 2–60 seconds 5–30 seconds |

The nickel coated carrier strip is first made anodic and then cathodic to form reduced nickel oxides. Approximately 5 microns of copper is then applied as the metal foil layer followed by a dendritic treatment as described above.

In each of embodiments 1–4, an alkaline copper plating bath was preferably used to deposit a seed layer having a thickness of from about 0.1 to about 0.5 micron of copper prior to depositing up to 5 microns of copper plating in an acidic bath. In the alternative first embodiment, the subsequent deposition of copper from an acidic bath is omitted. The initial use of an alkaline copper bath avoids potential attack to the chromium oxide, nickel oxide or nickel phosphate release layer as could happen in the acidic copper bath thus improving the reliability/integrity of the release interface. Embodiments five and six describe methods for forming a composite material having similar reliability and integrity without the need for an alkaline copper bath.

In embodiment five, a smooth nickel deposit is formed on the copper alloy carrier strip utilizing a suitable nickel plating bath, such as the nickel sulfamate electrolyte of Table 5. The nickel plated carrier strip is then immersed in an aqueous electrolyte containing sodium hydroxide utilizing the parameters recited in Table 7. The carrier strip is first made anodic and then cathodic. A copper metal foil layer is then deposited using a copper sulphate bath (Table 3) followed by dendritic treatment (Table 4).

In a sixth embodiment, a thin layer of nickel, having a thickness on the order of between 0.05 micron and 2 microns, is applied to the carrier strip (Table 5) as described above followed by treatment in an aqueous solution containing sodium hydroxide with the carrier strip first forming the anode and then the cathode as in Table 7. Next, the nickel is treated cathodically in an acid copper sulfate bath at low current density and the parameters illustrated in Table 8.

TABLE 8

| | |
|---|---|
| Copper ions, such as from copper sulfate | 40–80 g/l (broad) 60–70 g/l (preferred) |
| Sulfuric acid | 50–100 g/l (broad) 60–75 g/l (preferred) |
| Operating Temperature | 35° C.–60° C. |
| pH | Less than 1 |
| Cathode Material | Lead or copper |
| Voltage | 5–8 volts |
| Current Density | 0.03–2 ASF (broad) 0.05 ※ 0.5 ASF (preferred) |
| Time | 30–120 seconds (broad) 45–90 seconds (preferred) |

Copper deposition as in Table 3 is then utilized to increase the thickness up to a nominal 5 microns. Dendritic treatment as in Table 4 completes the process.

Composite materials formed from any one of the above processes may then be used to manufacture either printed circuit boards or flex circuits as described above. The advantages of the invention will become more apparent from the examples that follow.

In an alternative embodiment of the invention, the presence of pinholes in the foil may be reduced by employing methods of surface preparation on the exposed surface of the carrier strip that result in a smoother, more uniform surface. Examples of such methods of preparation include making use of oxygen free copper for the carrier strip, as well as smooth rolling, micro-etching, and flashing the surface of the carrier strip with copper or nickel solutions.

The presence of oxygen in copper carrier strips can give rise the formation of pits in the exposed surface of the carrier strip arising from the presence of copper oxide particles. When the release layer and foil are deposited over these pits, they conform to the structure of the pits. As a result, when the carrier strip is removed from the foil, the portions of the foil deposited into the pits often times break off from the foil. This breakage can result in pinholes on the surface of the foil or undesirable imperfections to the otherwise relatively uniform surface of the foil.

Therefore, one embodiment of the present invention incorporates the use of oxygen free copper for the carrier strip. The use of oxygen free copper reduces or largely eliminates the presence of copper oxide particles, thus reducing the attendant pits, and providing for a more uniform foil surface both before and after separation from the carrier strip.

Additional methods employed in the present invention to produce a more uniform carrier strip surface include smooth rolling, microetching, and exposing the surface of the carrier strip onto which the release layer is to be deposited to a copper or nickel flash. Examples of microetching capable of smoothing the surface of the carrier strip to a desirable uniformity include, but are not limited to, the application of a 1 lb./gal. ammonium persulfate solution with 3 v % sulfuric acid mixture at 115° F. for approximately 50 seconds. As stated above, the carrier strip may be coated with a copper or nickel flash to cover up defects, such as those incurred during rolling, that may adversely impact the uniform roughness of the surface of the carrier strip.

In another embodiment of the present invention, a dark and non-reflective layer is interposed between the release layer and the foil. The dark and non-reflective coating remains bonded to the foil after separation from the carrier strip and enhances the ability of the copper foil to be fashioned through the use of a laser.

There are, in general, two types of lasers that are used to drill through or otherwise remove portions of metallic foil. The first type includes $CO_2$ lasers which emit light in the IR range. The second type of lasers includes YAK lasers which emit light in the UV range. While YAK lasers can drill directly through copper foil, such lasers tend to do so at a relatively slow rate. In contrast, $CO_2$ lasers are capable of transmitting more energy per unit of time to the foil and, hence, drilling through the foil at a relatively faster rate. However, $CO_2$ layers are generally incapable of drilling through copper foil directly. Rather, in order to drill through metallic foil, a $CO_2$ laser requires that the surface of the foil be treated in such a manner as to render it both dark and non-reflective. As used herein, ※ non-reflective※ refers to the property exhibited by a surface that substantially absorbs, rather than reflects, the energy contained in light which interacts with the surface.

Therefore, with reference to FIG. 15, in one embodiment of the present invention, there is interposed between the release layer 16 and the metal foil layer 14 a dark layer 13 comprised of dark material. After the carrier layer 12 and release layer 16 are removed, the dark layer 13 remains bonded to the metal foil layer 14 to facilitate drilling by a $CO_2$ laser. The dark layer 13 is preferably formed of between approximately 0.05 and 0.5 microns of a nickel-copper combination, cobalt, tin, manganese, iron, or nickel layer. Most preferably the dark layer is approximately 0.2 microns in thickness. In order to render the dark layer 13 non-reflective, the surface of the carrier strip 12 opposite the dark layer 13 is made uniformly rough. Because the surface texture of the carrier strip 12 is imprinted upon the side of the dark layer opposite the attached foil, the dark layer assumes a surface texture similar to that of the uniformly rough carrier strip 12 surface.

There exist several methods by which the surface of the carrier strip 12 can be made suitably uniformly rough. These methods include, but are not limited to, nodule plating the surface of the carrier strip with pink or black copper bonding such as CopperBond ※ (a registered trademark of the Olin Corporation of Norwalk, Conn.), sandblasting the surface of the carrier strip, microetching the surface of the carrier strip, and rough rolling the carrier strip.

The resultant non-reflective dark layer facilitates the use of a laser, preferably a $CO_2$ laser, to drill through the dark layer and the underlying foil layer. In addition to drilling holes in this manner, the laser may be manipulated to etch into the foil a desired circuit schema such as one required to form an integrated circuit.

EXAMPLES

Example 1

A 2 oz. wrought copper foil was used as a carrier strip. The strip was electrocleaned in an alkaline commercial cleaner using 20 ASF current density for 40 sec. The foil was rinsed and then the release layer treatment was conducted in 20–35 g/l NaOH+0.5–5 g/l chromium ions as sodium dichromate solution using an anodic current of 1–5 ASF followed by a cathodic current of 1–20 ASF for 5–20 sec. The anodic treatment appeared to generate a uniform microroughness on the surface of the foil and induce a uniform copper deposit. The cathodic treatment appeared to deposit a transparent layer of chromium and chromium oxides, which is believed to be responsible for the release of the carrier strip after lamination.

A seed layer of 0.1–0.5 micron copper was electroplated in an alkaline copper plating solution. A 5 micron copper deposit was then electroplated, using 60–70 g/l copper ions as copper sulfate and 60–75 g/l sulfuric acid at 40–100 ASF for 5.4–2.1 minutes, followed by a dendritic copper or copper/nickel treatment. After lamination to an FR-4 epoxy substrate, the 2 oz carrier was easily peeled with a measured bond strength of 0.1–1.0 lb/in.

Example 2

A 2 oz. wrought copper foil was used as a carrier strip. The strip was electrocleaned in an alkaline commercial cleaner using 20 ASF current density for 40 sec. The foil was rinsed and then the release layer treatment applied by electroplating in a solution of 20–35 g/l NaOH+0.5–5 g/l chromium ions as sodium dichromate. This treatment appeared to form a transparent layer of chromium and chromium oxides.

A seed layer of 0.1–0.5 micron copper was electroplated in an alkaline copper plating solution. A 5 micron copper deposit was then electroplated using 60–70 g/l copper ions as copper sulfate and 60–75 g/l sulfuric acid at 40–100 ASF for 5.4–2.1 minutes, followed by a dendritic copper or copper/nickel treatment. After lamination to an FR-4 epoxy substrate, the 2 oz. carrier was easily peeled with a measured bond strength of 0.1–1.0 lb/in.

Example 3

After cleaning the copper carrier strip, a nickel layer was first electroplated with 0.15 micron nickel in a nickel sulfamate bath at 30 ASF for 20 sec. The foil was then immersed in a solution containing 0.2–10.0 g/l chromic acid and 0.5–40 g/l phosphoric acid for 10–40 sec at ambient temperature. The alkaline copper seed layer and acidic copper plating were conducted as described in Example 1. A peelable foil resulted after lamination with 0.2–2.0 lb/in release force.

Example 4

As in Example 3, a nickel layer was first electroplated. The nickel surface was then anodically treated in a 20–50 g/l NaOH solution at 0.5–10 ASF for 5–30 sec to generate a nickel oxide release layer. This nickel oxide layer was then cathodically reduced in a 20–50 g/l NaOH solution at 0.5–50 ASF for 5–30 sec. This cathodic treatment appeared to produce reduced oxides and enlarge the operating window. Without the cathodic treatment, if the anodic current is too low, a non-peelable foil would be produced. If the anodic current is too high, the plated 5 micron foil often delaminates or forms blister even before lamination and renders the product useless.

After the nickel and nickel oxide treatment, the alkaline copper seed layer and 5 micron acidic copper are deposited. A release force of 0.35–1.0 lb/in was obtained.

Example 5

The formation of a smooth nickel deposit onto a carrier strip has been shown to be very easily accomplished by deposition out of a nickel sulfamate bath using a current density of 30 to 50 ASF with times of 20 to 30 seconds.

Treatment of the nickel plate in a solution of 30 g/l sodium hydroxide was then conducted with an anodic treatment of 20 to 40 ASF for 20 to 40 seconds with subsequent cathodic treatment in the same solution at 25% to 50% of the anodic current density and for half the time. No seed layer was used, rather the nickel coated support layer was cathodically treated in acid-copper sulfate bath at low current density, 60 seconds at 0.03 to 2 ASF, followed by plating of copper from the acid copper sulfate bath at 65 ASF for 3.5 minutes to achieve the desired 5 micron thickness. The foils retained their peelability following lamination.

For comparison, it was demonstrated that the above low current treatment resulted in peelable foils free of defects while foils made using identical conditions, but without the low current treatment, were full of defects and not peelable following lamination.

Example 6

The effect of the release layer on the separation force required to separate a copper foil layer from a copper support layer is graphically illustrated in FIG. 14. Both a chromium metal release layer, as known from the prior art, and a chromium plus chromium oxide release layer as disclosed herein were effective to provide a relatively low, less than 8.9 kg/m (0.5 pounds per inch), separation force at room temperature. Even when heated to temperatures of up to 200° C. and remaining at temperature for one hour, the separation forces are about equal. However, at temperatures above 200° C., the separation force for the chromium release layer (reference line 38) increases rapidly while there is no increase in the separation force for the chromium plus chromium oxide release layer (reference line 40).

This example illustrates the wider processing window available for lamination utilizing the release layer of the invention.

Example 7

FIGS. 8 and 10 illustrate that more vertical side walls 42 are obtained utilizing the 5 micron foil as compared to the 12 micron foil. To avoid the presence of short circuits, etching must be for a time effective to ensure substantial removal of copper from the surface of the dielectric 22. Since the surface of the foil opposite the dielectric carrier 22 is exposed to the etching solution for a longer time than the surface adjacent the dielectric carrier, a circuit trace width reduction at that opposing surface occurs. Due to the longer etching time for the 12 micron foil, this over-etching is more pronounced.

Table 9 demonstrates conductive circuit traces having a nominal width as indicated when formed by photopatterning a 38 micron thick dry film photo resist and then etching in an alkaline solution at a temperature of 52° C. The 5 micron foil required approximately half the etch time of the 12 micron foil. From Table 9, it may be seen that the conductor width is closer to that of the designated conductor width for 5 micron foil than for 12 micron foil.

TABLE 9

| Designed Conductor Width | Etched Conductor Width ($\mu$m) | |
|---|---|---|
| ($\mu$m) | 5 $\mu$m foil | 12 $\mu$m foil |
| 50 | 40 | 24 |
| 75 | 68 | 52 |
| 100 | 92 | 76 |
| 125 | 117 | 101 |

TABLE 10

| Feature | % Fewer Defects (5 $\mu$m vs. 12 $\mu$m foil) |
|---|---|
| 50 $\mu$m conductors | 30 |
| 75 $\mu$m conductors | 4 |
| 100 $\mu$m conductors | 65 |
| 125 $\mu$m conductors | 62 |
| 50 $\mu$m spaces | 31 |
| 75 $\mu$m spaces | 19 |

TABLE 11

| Sample ID | Anodic/Cathodic Current (asf) | After lamination C7025 carrier | After lamination C110 carrier |
|---|---|---|---|
| 1 | 1.7 | Cracked open | Weak release |
| 2 | 1.25 | Weak release | Weak release |
| 3 | 1.1 | Cracked open | Weak release |
| 4 | 1.0 | Weak release | No release |
| 5 | 0.8 | Cracked open | No release |
| 6 | 0.6 | No release | No release |

Additional Parameters:
Anodic current plating time = 10 seconds
Anodic/cathodic bath temperature = 36–37 C.
Alkaline copper current 30 asf × 20 sec, 52–55 C.

A 1 ounce C110 foil and 1 ounce C7025 foil were utilized to form carrier strips. Prior to cleaning in NaOH the foil samples were immersed in 10% sulfuric acid to remove any surface oxides. To provide consistency none of the solutions were stirred. As the objective of the test was to compare the capability of foils of differing tensile strengths in providing a controllable release force, the parameters under which the tests were conducted were held constant while the two foils differed only in tensile strength. The tensile strength of C7025 was approximately 100 ksi after lamination and the tensile strength of C110 was approximately 30 ksi after lamination.

As table 11 illustrates, the release force of both foils is dependent upon the anodic/cathodic current parameters. The break off point for anodic/cathodic current is 0.8 asf for the C7025 foil and 1.1 for the C110 foil. As used herein, "break off point" refers to the minimum anodic/cathodic current treatment value at which release is enabled.

It is apparent that there has been provided in accordance with the present invention a composite material including a releasable metal foil layer and methods for the manufacture of such a composite material that fully satisfies the objects, means and advantages as set forth herein above. While the invention has been described in combination with embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A composite material, comprising:

a carrier strip said carrier strip comprising a first side said first side possessing a substantially uniform roughness wherein said substantially uniform roughness results from flashing said first side of said carrier strip with copper or nickel;

an electrolytically deposited copper foil layer having opposing first and second sides and a thickness of from 0.1 micron to 15 microns;

a dark layer effective to absorb light energy said dark layer having opposing first and second sides said first side of said dark layer in contact with said second side of said copper foil layer; wherein said dark layer has a thickness between 0.2 and 0.5 microns, said dark layer comprised of a material selected from the group consisting of copper, nickel, tin, manganese, iron, and copper-nickel alloys; and a release layer effective to facilitate separation of said carrier strip from said dark layer disposed between and contacting both said first side of said carrier strip and said second side of said dark layer and effective to transmit the surface characteristics of said first side of said carrier strip to said second side of said dark layer.

* * * * *